US012622026B2

(12) United States Patent
Iwahashi et al.

(10) Patent No.: US 12,622,026 B2
(45) Date of Patent: May 5, 2026

(54) SEMICONDUCTOR DEVICE AND METHOD FOR MANUFACTURING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Yohei Iwahashi, Nisshin-city (JP); Jun Saito, Nisshin-city (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 756 days.

(21) Appl. No.: 17/955,625

(22) Filed: Sep. 29, 2022

(65) Prior Publication Data

US 2023/0111246 A1 Apr. 13, 2023

(30) Foreign Application Priority Data

Oct. 8, 2021 (JP) ................................. 2021-166063

(51) Int. Cl.
| | |
|---|---|
| *H01L 29/10* | (2006.01) |
| *H01L 21/04* | (2006.01) |
| *H10D 12/01* | (2025.01) |
| *H10D 30/66* | (2025.01) |
| *H10D 62/10* | (2025.01) |

(Continued)

(52) U.S. Cl.
CPC ......... *H10D 62/393* (2025.01); *H01L 21/046* (2013.01); *H10D 12/031* (2025.01); *H10D 30/665* (2025.01); *H10D 30/668* (2025.01); *H10D 62/107* (2025.01); *H10D 62/109* (2025.01); *H10D 62/8325* (2025.01)

(58) Field of Classification Search
CPC .. H10D 62/393; H10D 12/031; H10D 30/665; H10D 30/668; H10D 62/107; H10D 62/109; H10D 62/8325; H10D 12/481; H10D 12/038; H10D 30/0297; H10D 62/051; H10D 62/111; H10D 62/105; H10D 62/106; H01L 21/046
See application file for complete search history.

(56) References Cited

U.S. PATENT DOCUMENTS

2001/0048132 A1 12/2001 Ito et al.
2004/0166637 A1 8/2004 Ito et al.
(Continued)

*Primary Examiner* — Cuong B Nguyen
(74) *Attorney, Agent, or Firm* — Posz Law Group, PLC

(57) ABSTRACT

A base layer has a low concentration peak at a position between a portion located at a same depth as a lower end portion of a gate electrode and a portion located at a same depth as an upper end portion of the gate electrode in a concentration profile of an impurity concentration in a depth direction. An impurity region has a boundary with the base layer in the depth direction at a position between a first peak position, at which the impurity concentration of the base layer is maximum between the portion located at the same depth as the lower end portion and the position of the low concentration peak, and a second peak position, at which the impurity concentration of the base layer is maximum between the position of the low concentration peak and the portion located at the same depth as the upper end portion.

4 Claims, 11 Drawing Sheets

(51) Int. Cl.
  *H10D 62/17*   (2025.01)
  *H10D 62/832*  (2025.01)

(56)      References Cited

U.S. PATENT DOCUMENTS

| | | |
|---|---|---|
| 2004/0262678 A1 | 12/2004 | Nakazawa et al. |
| 2005/0167746 A1 | 8/2005 | Nakazawa et al. |
| 2006/0180856 A1 | 8/2006 | Nakazawa et al. |
| 2012/0153303 A1 | 6/2012 | Uchida |
| 2015/0084124 A1 | 3/2015 | Saito et al. |
| 2018/0197947 A1* | 7/2018 | Iwaya ................... H10D 62/109 |
| 2019/0181261 A1* | 6/2019 | Okumura ............. H10D 62/105 |
| 2022/0216335 A1* | 7/2022 | Okumura ............. H10D 62/157 |
| 2022/0293724 A1 | 9/2022 | Saito et al. |

\* cited by examiner

SEMICONDUCTOR DEVICE AND METHOD FOR MANUFACTURING THE SAME

CROSS REFERENCE TO RELATED APPLICATION

The present application claims the benefit of priority from Japanese Patent Application No. 2021-166063 filed on Oct. 8, 2021. The entire disclosure of the above application is incorporated herein by reference.

TECHNICAL FIELD

The present disclosure relates to a semiconductor device having a trench gate structure and a manufacturing method thereof.

BACKGROUND

Conventionally, a semiconductor device including a semiconductor element such as a metal oxide semiconductor field effect transistor (MOSFET) has been proposed.

SUMMARY

The present disclosure provides a semiconductor device including a base layer, an impurity region disposed in a surface layer portion of the base layer, and a trench gate structure. The trench gate structure includes a trench penetrating the impurity region and the base layer, a gate insulating layer disposed on a wall surface of the trench, and a gate electrode disposed on the gate insulating layer. The base layer has a low concentration peak at a position between a portion located at a same depth as a lower end portion of the gate electrode and a portion located at a same depth as an upper end portion of the gate electrode in a concentration profile of an impurity concentration in a depth direction. An impurity region has a boundary with the base layer in the depth direction at a position between a first peak position, at which the impurity concentration of the base layer is maximum between the portion located at the same depth as the lower end portion and the position of the low concentration peak, and a second peak position, at which the impurity concentration of the base layer is maximum between the position of the low concentration peak and the portion located at the same depth as the upper end portion.

The present disclosure also provides a manufacturing method of the semiconductor device.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
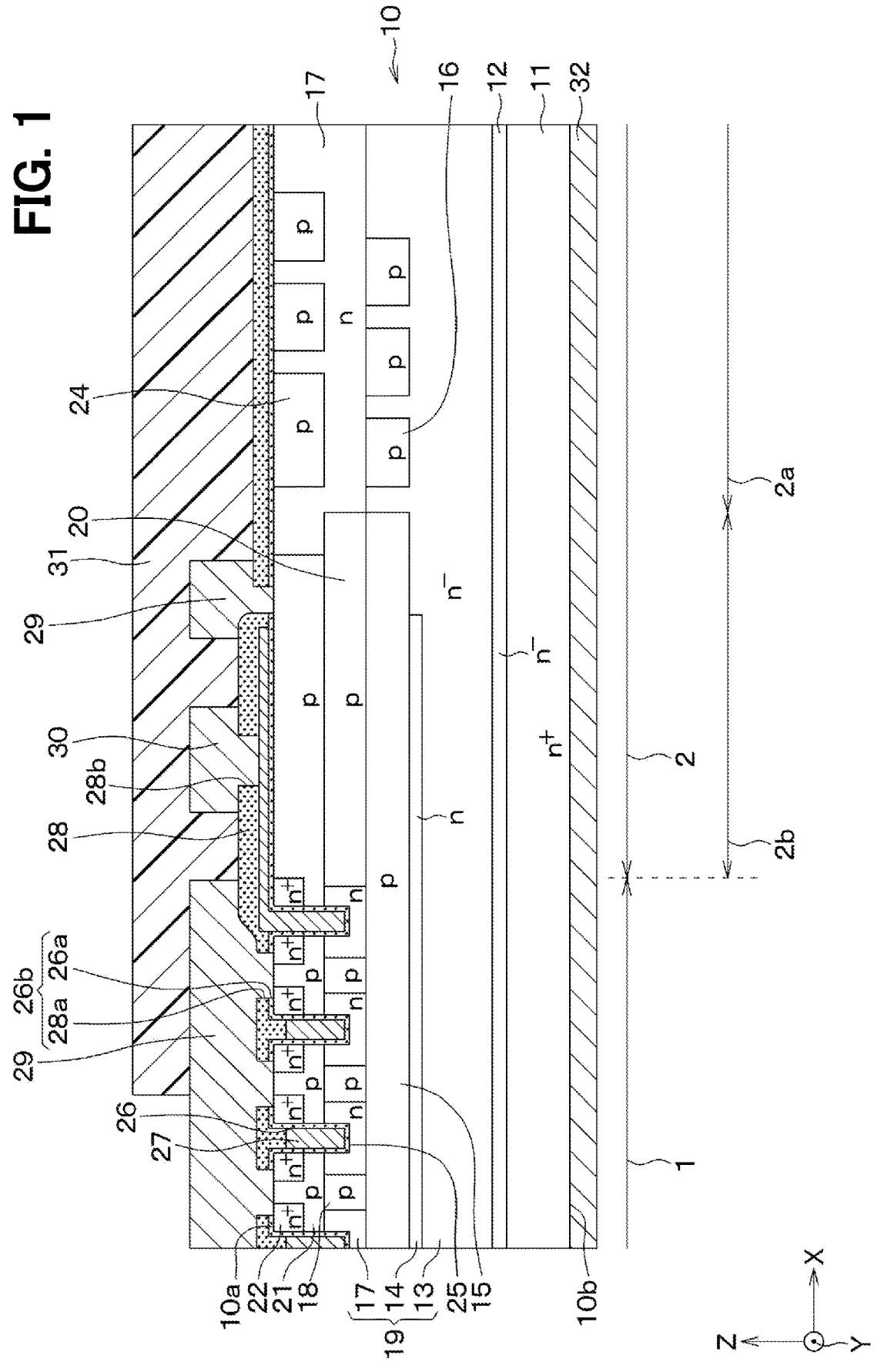
FIG. 1 is a cross-sectional view of a SiC semiconductor device according to a first embodiment.

A semiconductor device may include a semiconductor substrate having a drift layer, a base layer formed to one surface side of the semiconductor substrate, and a source region formed in a surface layer portion of the base layer. The semiconductor substrate may have a trench penetrating the source region and the base layer. A gate insulating film and a gate electrode may be disposed in the trench to form a trench gate structure.

A drain region may be disposed to the other surface side of the semiconductor substrate. An upper electrode may be disposed to the one surface side of the semiconductor substrate so as to be electrically connected to the source region and the base layer. A lower electrode may be disposed to the other surface side of the semiconductor substrate so as to be electrically connected to the drain region.

In the above-described semiconductor device, when a voltage equal to or higher than a threshold voltage in an insulated gate structure is applied to the gate electrode, an inversion layer (that is, a channel) is formed in a portion of the base layer in contact with the trench. Then, a current flows between the upper electrode and the lower electrode in the semiconductor device through the inversion layer.

In a case where the base layer is formed so that the impurity concentration is substantially constant from the one surface side to a position at a predetermined depth, if the depth of the source region varies, the change in threshold voltage may increase.

A semiconductor device according to a first aspect of the present disclosure includes a semiconductor element. The semiconductor element includes a drift layer of a first conductivity type, a base layer of a second conductivity type, a trench gate structure, a high concentration layer of the first conductivity type or the second conductivity type, a first electrode, and a second electrode. The base layer is disposed in a surface layer portion of the drift layer. The impurity region is disposed in a surface layer portion of the base layer and has an impurity concentration higher than an impurity concentration of the drift layer. The trench gate structure includes a trench penetrating the impurity region and the base layer to reach the drift layer, a gate insulating film disposed on a wall surface of the trench, and a gate electrode disposed on the gate insulating film. The high concentration layer is disposed opposite from the base layer across the drift layer and has an impurity concentration higher than the impurity concentration of the drift layer. The first electrode is electrically connected to the base layer and the impurity region. The second electrode is electrically connected to the high concentration layer. An end portion of the gate electrode located adjacent to a bottom of the trench is defined as a lower end portion. An end portion of the gate electrode located adjacent to an opening of the trench is defined as an upper end portion. A direction in which the drift layer and the base layer are stacked is defined as a depth direction. The base layer has a concentration profile of an impurity concentration in the depth direction. In the concentration profile, the base layer has a low concentration peak, at which the impurity concentration is minimum, at a position between a portion located at a same depth as the lower end portion and a portion located at a same depth as the upper end portion. A position at which the impurity concentration of the base layer is maximum between the portion at the same depth as the lower end portion and the position of the low concentration peak is defined as a first peak position, and a position at which the impurity concentration of the base layer is maximum between the position of the low concentration peak and the portion at the same depth as the upper end portion is defined as a second peak position. The impurity region has a boundary with the base layer in the depth direction at a position between the first peak position and the second peak position.

In the semiconductor device according to the first aspect, the position of the boundary of the impurity region with the base layer, that is, a boundary position is located between the first peak position and the second peak position of the base layer in the depth direction. Therefore, even if the depth of the impurity region varies, the boundary position of the impurity region with the base layer is less likely to intersect a portion of the base layer where the impurity concentration is high. Therefore, even if the depth of the impurity region varies, the change in effective concentration is likely to be small, and the change in threshold voltage can be suppressed.

A manufacturing method according to a second aspect of the present disclosure is a manufacturing method of the semiconductor device according to the first aspect. The manufacturing method includes forming the base layer in the surface layer portion of the drift layer, and forming the impurity region in the surface layer portion of the base layer. The forming the base layer includes forming the base layer having the concentration profile by performing ion implantation a plurality of times while changing an acceleration energy. The forming the impurity region includes performing ion implantation so that the boundary of the impurity region with the base layer is located between the first peak position and the second peak position in the depth direction.

According to the above method, the position of boundary of the impurity region with the base layer, that is, the boundary position is formed between the first peak position and the second peak position of the base layer in the depth direction. Therefore, even if the depth of the impurity region varies, the boundary position of the impurity region with the base layer is less likely to intersect the portion of the base layer where the impurity concentration is high. Therefore, the above method can manufacture the semiconductor device in which the change in the effective concentration is likely to be small and the fluctuation of the threshold voltage is suppressed even if the depth of the impurity region varies.

Hereinafter, embodiments of the present disclosure will be described with reference to the drawings. In each embodiment described below, same or equivalent parts are designated with the same reference numerals.

First Embodiment

A first embodiment will be described with reference to the drawings. A semiconductor device of the present embodiment is preferably mounted on a vehicle such as an automobile and applied as a device for driving various electronic devices for the vehicle. Further, in the present embodiment, a SiC semiconductor device in which an inverted MOSFET having a trench gate structure is formed as a semiconductor element will be described.

The SiC semiconductor device of the present embodiment has a cell region 1 in which a MOSFET having a trench gate structure is formed and an outer peripheral region 2 surrounding the cell region 1. The peripheral region 2 has a field limiting ring (FLR) region 2a and a connecting region 2b arranged inside the FLR region 2a. In other words, the peripheral region 2 has the FLR region 2a and the connecting region 2b arranged between the cell region 1 and the FLR region 2a.

Hereinafter, one direction in a surface direction of a substrate 11, which will be described later, is defined as an X-axis direction, a direction intersecting the one direction in the surface direction of the substrate 11 is defined as a Y-axis direction, and a direction orthogonal to the X-axis direction and the Y-axis direction is defined as a Z-axis direction. In the present embodiment, the X-axis direction is orthogonal to the Y-axis direction. For example, the left-right direction in the drawing of FIG. 1 corresponds to the X-axis direction, the depth direction in the drawing of FIG. 1 corresponds to the Y-axis direction, and the up-down direction in the drawing of FIG. 1 corresponds to the Z-axis direction. However, the Z-axis direction in the embodiment corresponds to a depth direction of a semiconductor substrate 10, which will be described later, and also corresponds to a stacking direction of a drift layer 19 and a base layer 21, which will be described later.

Figure 2:
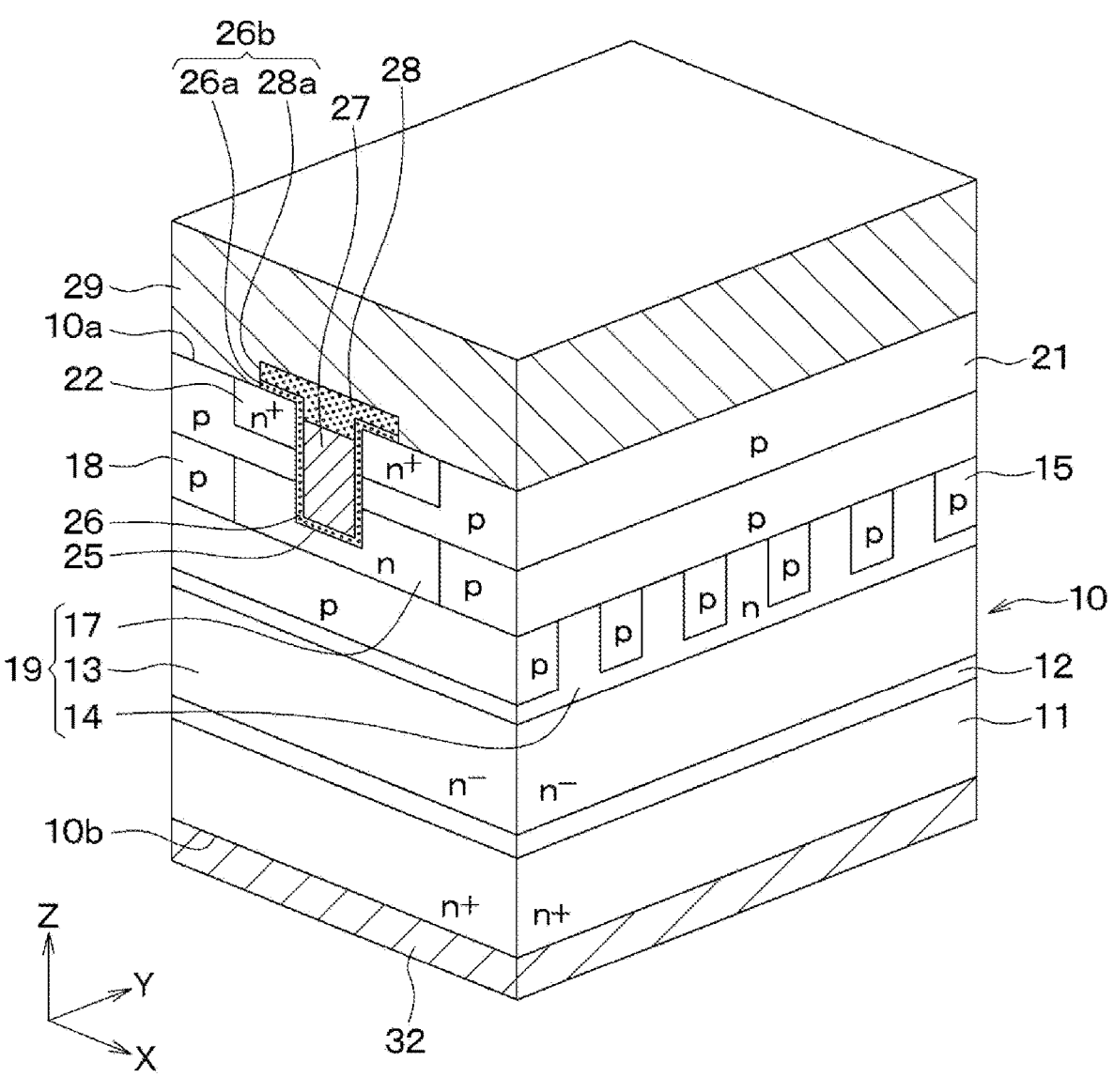
FIG. 2 is a perspective sectional view showing a cell region in FIG. 1.

As illustrated in FIG. 1 and FIG. 2, the SiC semiconductor device includes the semiconductor substrate 10. The SiC semiconductor device includes an $n^+$-type substrate 11 made of SiC. In the present embodiment, the substrate 11 has an off-angle of 0 to 8 degrees with respect to, for example, a (0001) Si plane, and the substrate 11 has an n-type impurity concentration of, for example, $1.0 \times 10^{19}/cm^3$, such as nitrogen or phosphorus, and a thickness of about 300 μm. The substrate 11 constitutes a drain region in the present embodiment and corresponds to a high concentration layer.

An $n^-$-type buffer layer 12 made of SiC is formed on a surface of the substrate 11. The buffer layer 12 is formed by epitaxial growth on the surface of the substrate 11. The buffer layer 12 has an n-type impurity concentration between the impurity concentration of the substrate 11 and the impurity concentration of a low concentration layer 13, and has a thickness of 1 μm.

The $n^-$-type low concentration layer 13 made of SiC having an n-type impurity concentration of, for example, $5.0 \times 10^{15}/cm^3$ to $10.0 \times 10^{15}/cm^3$ and a thickness of about 10 μm to 15 μm is formed on a surface of the buffer layer 12. The low concentration layer 13 may have a constant impurity concentration along the Z-axis direction. However, the concentration distribution may be inclined so that the concentration of a portion of the low concentration layer 13 closer to the substrate 11 is higher than the concentration of the other portion farther from the substrate 11. For example, in the low concentration layer 13, a portion apart from the surface of the substrate 11 by about 3 μm to 5 μm may have an impurity concentration higher than that of other portions by about $2.0 \times 10^{15}/\text{cm}^3$. With the configuration described above, an internal resistance of the low concentration layer 13 can be reduced, and an on-resistance can be reduced.

In a surface layer portion of the low concentration layer 13, a junction field-effect transistor (JFET) portion 14 and a first deep layer 15 are formed in the cell region 1 and the connecting region 2b of the outer peripheral region 2. In the present embodiment, the JFET portion 14 and the first deep layer 15 are extended along the X-axis direction, and have linear portions arranged alternately and repeatedly along the Y-axis direction. In other words, the JFET portion 14 and the first deep layer 15 have stripe shapes extending along the X-axis direction in a direction normal to the surface of the substrate 11 (hereinafter simply referred to as a normal direction). The JFET portion 14 and the first deep layer 15 are aligned alternately along the Y-axis direction. In the normal direction to the surface of the substrate 11 means when viewed from the normal direction to the surface of the substrate 11.

The JFET portion 14 has an n-type impurity concentration higher than the low concentration layer 13, and has a depth of 0.3 μm to 1.5 μm. In the present embodiment, the JFET portion 14 has an n-type impurity concentration of $7.0 \times 10^{16}/\text{cm}^3$ to $5.0 \times 10^{17}/\text{cm}^3$.

For example, the first deep layer 15 has a p-type impurity such as boron with the concentration of $2.0 \times 10^{17}/\text{cm}^3$ to $2.0 \times 10^{18}/\text{cm}^3$. The first deep layer 15 of the present embodiment extends from the JFET portion 14 to the FLR region 2a.

The first deep layer 15 according to the present embodiment is formed shallower than the JFET portion 14. In other words, the first deep layer 15 is formed such that the bottom portion of the first deep layer 15 is located in the JFET portion 14. In other words, the first deep layer 15 is formed such that the JFET portion 14 is located between the first deep layer 15 and the low concentration layer 13.

In the surface layer portion of the low concentration layer 13, multiple p-type first FLR portions 16 are formed in the FLR region 2a of the outer peripheral region 2 so as to surround the cell region 1. In the present embodiment, the first FLR portions 16 are formed concentrically, for example, in rectangular frame shapes with rounded corners. However, the first FLR portions 16 may also be formed concentrically in other frame shapes such as circular frame shapes instead of the rectangular frame shapes. The first FLR portions 16 have bottom surfaces at the same depth as the bottom surface of the first deep layer 15 and have the same thickness as the first deep layer 15. In addition, the first FLR portions 16 have a p-type impurity concentration same as that of the first deep layer 15.

A current spreading layer 17, a second deep layer 18, a base layer 21, a source region 22 and the like are formed above the JFET portion 14 and the first deep layer 15 in the cell region 1. The current spreading layer 17 and second FLR portions 24 are formed above the low concentration layer 13 and the first FLR portions 16 in the FLR region 2a of the outer peripheral region 2. A reduced surface field (RESURF) layer 20, a base layer 21, and the like are formed above the JFET portion 14 and the first deep layer 15 in the connecting region 2b of the outer peripheral region 2.

The current spreading layer 17 is composed of an n-type impurity layer and is connected to the JFET portion 14 in the cell region 1. Thus, in the present embodiment, the low concentration layer 13, the JFET portion 14, and the current spreading layer 17 are connected, and the drift layer 19 is formed by the low concentration layer 13, the JFET portion 14, and the current spreading layer 17.

The second deep layer 18 has the same thickness as the current spreading layer 17. The second deep layer 18 is formed to be connected to the first deep layer 15.

In the cell region 1, the current spreading layer 17 and the second deep layer 18 extend in a direction intersecting the striped portion of the JFET portion 14 and the longitudinal direction of the first deep layer 15. In the present embodiment, the current spreading layer 17 and the second deep layer 18 extend along the Y-axis direction as a longitudinal direction, and have multiple portions alternately aligned along the X-axis direction. The formation pitch of the current spreading layer 17 and the second deep layer 18 corresponds to the formation pitch of a trench gate structure, which will be described later, and the second deep layer 18 is formed to sandwich each trench 25, which will be described later.

The RESURF layer 20 is formed in the connecting region 2b and has the same thickness as the current spreading layer 17 and the second deep layer 18. This RESURF layer 20 is p-type and is connected to the first deep layer 15 in the connecting region 2b.

The base layer 21 is p-type and is formed above the current spreading layer 17 and the second deep layer 18 in the cell region 1. In addition, the base layer 21 is formed above the RESURF layer 20 in the connecting region 2b. In a surface layer portion of the base layer 21 in the cell region 1, an n+-type source region 22 is formed. Specifically, the source region 22 is formed in contact with side surfaces of the trenches 25. In the present embodiment, the source region 22 corresponds to an impurity region.

The base layer 21 of the present embodiment is formed to have a predetermined concentration profile having a low concentration peak, which will be described in detail later. Further, the source region 22 is formed so that a lower surface close to the substrate 11 (that is, a boundary with the base layer 21 in the Z-axis direction) are located at a predetermined position, which will be described in detail later.

In the FLR region 2a, the current spreading layer 17 is arranged so as to form a first surface 10a of the semiconductor substrate 10. In a surface layer portion of the current spreading layer 17 in the FLR region 2a, multiple second FLR portions 24 are formed. The second FLR portions 24 of the present embodiment are formed to have portions facing the first FLR portions 16. The second FLR portions 24 have bottom surfaces at the same depth as the bottom surface of the base layer 21 and have the same thickness as the base layer 21. Furthermore, the second FLR portions 24 have the same concentration profile along the Z-axis direction as that of the base layer 21.

The second FLR portions 24 are formed concentrically, for example, in rectangular frame shapes with rounded corners. However, the second FLR portions 24 may also be formed concentrically in other frame shapes such as circular frame shapes instead of the rectangular frame shapes.

Furthermore, the first FLR portions 16 and the second FLR portions 24 of the present embodiment are formed in such a manner that gaps between the adjacent first FLR portions 16 and gaps between the adjacent second FLR portions 24 are located at different positions in the Z-axis direction. In other words, the first FLR portions 16 and the second FLR portions 24 of the present embodiment are formed in such a manner that the gaps between the adjacent first FLR portions 16 and the gaps between the adjacent second FLR portions 24 do not overlap in the Z-axis direction.

In the present embodiment, as described above, the semiconductor substrate 10 includes the substrate 11, the buffer layer 12, the low concentration layer 13, the JFET portion 14, the first deep layer 15, the first FLR portions 16, the current spreading layer 17, the second deep layer 18, the base layer 21, the source region 22, and the second FLR portions 24. The source region 22, the current spreading layer 17 and the like form the first surface 10a of the semiconductor substrate 10, and the substrate 11 forms the second surface 10b of the semiconductor substrate 10.

In the cell region 1, the semiconductor substrate 10 has the trenches 25. The trenches 25 penetrate the source region 22 and the base layer 21 to reach the current spreading layer 17, and bottom surfaces of the trenches 25 are located in the current spreading layer 17. Each of the trenches 25 has a width of 1.4 µm to 2.0 µm. The trenches 25 are formed not to reach the JFET portion 14 and the first deep layer 15. In other words, the trenches 25 are formed such that the JFET portion 14 and the first deep layer 15 are located below the bottom surfaces of the trenches 25.

The trenches 25 extend along the Y-axis direction, and have stripe shapes aligned at equal intervals along the X-axis direction. In the present embodiment, the trenches 25 are formed such that the longitudinal direction of the trenches 25 is orthogonal to the longitudinal direction of the first deep layer 15. In addition, the trenches 25 are formed to be sandwiched by the second deep layer 18 in the normal direction.

On an inner wall surface of each of the trenches 25, a gate insulating film 26 is formed. On the gate insulating film 26, a gate electrode 27 made of doped polysilicon is formed. Accordingly, the trench gate structure is formed. Although not particularly limited, the gate insulating film 26 is formed by thermally oxidizing the inner wall surface of each of the trenches 25 or by performing a chemical vapor deposition (CVD) method. The gate insulating film 26 has a thickness of about 100 nm on both the side and the bottom of each of the trenches 25.

The gate insulating film 26 is also formed on a surface other than the inner wall surface of each of the trenches 25. Specifically, the gate insulating film 26 is formed so as to also cover a part of the first surface 10a of the semiconductor substrate 10 in the cell region 1. More specifically, the gate insulating film 26 is formed so as to also partially cover the surface of the source region 22. In other words, the gate insulating film 26 has contact holes 26a that expose the base layer 21 and the source region 22 at portions different from the portions where the gate electrodes 27 are arranged.

The gate insulating film 26 is also formed on the surface of the base layer 21 in the connecting region 2b and the surfaces of the current spreading layer 17 and the second FLR portions 24 in the FLR region 2a. The gate electrode 27 extends to the surface of the gate insulating film 26 in the connecting region 2b. The trench gate structure of the present embodiment is formed as described above.

Above the first surface 10a of the semiconductor substrate 10, an interlayer insulating film 28 is formed to cover the gate electrode 27, the gate insulating film 26, and the like. The interlayer insulating film 28 is made of borophosphosilicate glass (BPSG).

The interlayer insulating film 28 has contact holes 28a configured to communicate with the contact hole 26a and expose the source region 22 and the base layer 21. The interlayer insulating film 28 also has a contact hole 28b configured to expose a portion of the gate electrode 27 extending to the connecting region 2b. In other words, the interlayer insulating film 28 has the contact holes 28a formed in the cell region 1 and the contact hole 28b formed in the outer peripheral region 2.

Each of the contact holes 28a formed in the interlayer insulating film 28 is formed so as to communicate with corresponding one of the contact holes 26a formed in the gate insulating film 26, and functions together with the corresponding one of the contact hole 26a as one contact hole. In the following, the contact holes 26a and the contact holes 28a are collectively referred to as contact holes 26b. The contact holes 26b may have any pattern. For example, the contact holes 26b may have a pattern in which multiple square holes are arranged, a pattern in which rectangular linear holes are arranged, or a pattern in which linear holes are arranged. In the present embodiment, the contact holes 26b have linear shapes along the longitudinal direction of the trenches 25.

On the interlayer insulating film 28, a source electrode 29 electrically connected to source region 22 and base layer 21 through the contact holes 26b is formed. In the present embodiment, the source electrode 29 corresponds to a first electrode. The source electrode 29 of the present embodiment is also connected to the base layer 21 of the peripheral region 2. On the interlayer insulating film 28, a gate wiring 30 electrically connected to the gate electrode 27 through the contact hole 28b is also formed.

The source electrode 29 of the present embodiment is composed of, for example, a plurality of metals such as Ni/Al. A portion of the multiple metals, which is in contact with a portion forming an n-type SiC (that is, the source region 22), is made of a metal capable of making ohmic contact with the n-type SiC. In addition, at least a portion of the multiple metals that is in contact with a portion forming a p-type SiC (that is, the base layer 21) is made of a metal capable of making ohmic contact with the p-type SiC. The gate wiring 30 may have the same structure as the source electrode 29, or may be made of Al—Si or the like.

Furthermore, a protective film 31 made of polyimide or the like is formed to cover the connecting region 2b and the FLR region 2a. In the embodiment, the protective film 31 is formed from the outer peripheral region 2 to the outer edge of the cell region 1 in order to suppress the generation of creeping discharge between the source electrode 29 and a drain electrode 32, which will be described later. Specifically, in the cell region 1, the protective film 31 is formed so as to cover a portion of the source electrode 29 close to the outer peripheral region 2 while exposing a portion of the source electrode 29 far from the outer peripheral region 2.

On the second surface 10b of the semiconductor substrate 10, the drain electrode 32 that is electrically connected to the substrate 11 is formed. In the present embodiment, the drain electrode 32 corresponds to a second electrode.

In the SiC semiconductor device according to the present embodiment, with such a structure, MOSFET of an n-channel type inverted trench gate structure is formed in the cell region 1. In the present embodiment, the n-type, the n$^+$-type, and the n$^-$-type correspond to a first conductive type, and the p-type, the p$^-$-type, and p$^+$-type correspond to a second conductive type.

Next, the concentration profile of the base layer 21 and the source region 22 along the Z-axis direction (that is, the depth direction of the semiconductor substrate 10) in the present embodiment will be described. Hereinafter, an end portion of the gate electrode 27 located adjacent to the bottom of the trench 25 is also referred to as a lower end portion, and an end portion of the gate electrode 27 located adjacent to an opening of the trench 25 is also referred to as an upper end portion. Furthermore, a position of the semiconductor substrate 10 located at the same depth as the lower end portion of the gate electrode 27 is defined as a first depth position dL, and a position of the semiconductor substrate 10 located at the same depth as the upper end portion of the gate electrode 27 is defined as a second depth position dU.

Figure 3:
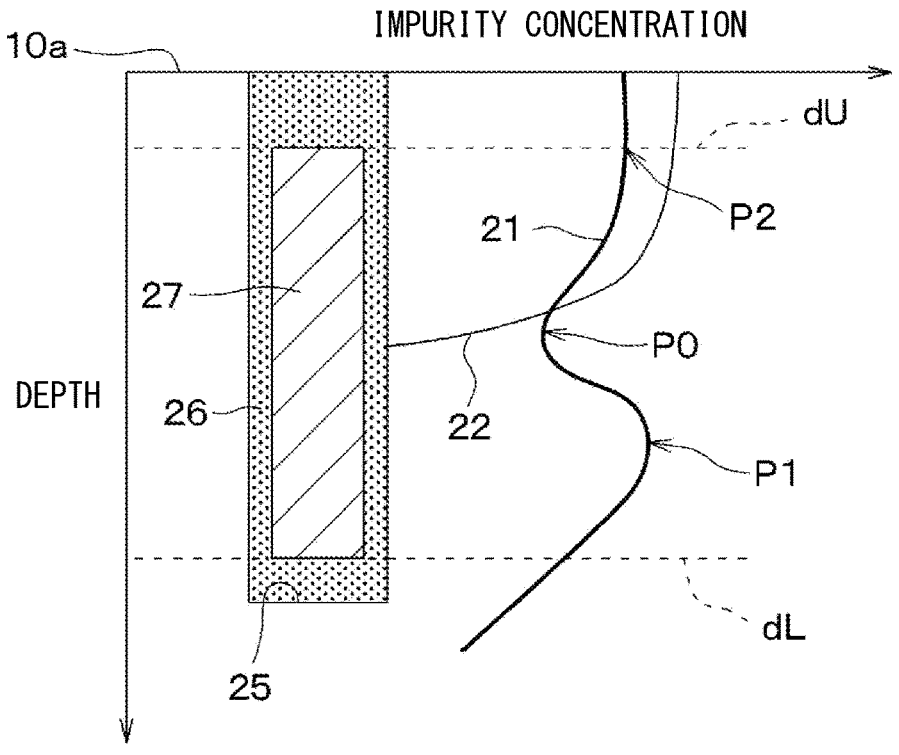
FIG. 3 is a diagram showing a relationship between a depth of a semiconductor substrate and an impurity concentration.

As shown in FIG. 3, the base layer 21 of the present embodiment has a concentration profile in which a low concentration peak, at which the impurity concentration is minimum, is located between the first depth position dL and the second depth position dU in the Z-axis direction. That is, the base layer 21 has a concentration profile in which the impurity concentration increases and decreases before and after the low concentration peak in the depth direction. Hereinafter, the position of the low concentration peak of the base layer 21 will be referred to as a low concentration peak position P0. Further, in the base layer 21, a position where the impurity concentration is maximum between the first depth position dU and the low concentration peak position P0 is defined as a first peak position P1. In the base layer 21, a position at which the impurity concentration is maximum between the low concentration peak position P0 and the second depth position dU is defined as a second peak position P2. That is, when the impurity concentration at the first peak position P1 is defined as a first high concentration peak and the impurity concentration at the second peak position P2 is defined as a second high concentration peak, the base layer 21 has a concentration profile including the low concentration peak, the first high concentration peak, and the second high concentration peak.

The base layer 21 of the present embodiment is formed such that the second peak position P2 matches the second depth position dU. The base layer 21 is also formed such that the impurity concentration at the first peak position P1 (that is, the first high concentration peak) is higher than the impurity concentration at the second peak position P2 (that is, the second high concentration peak). Note that the base layer 21 having the above-described concentration profile is formed by performing ion implantation multiple times while changing the acceleration energy, which will be described in detail later. The second FLR portions 24 have the same concentration profile as the base layer 21 as described above.

The source region 22 has a concentration profile in which the impurity concentration gradually decreases in the Z-axis direction. However, the source region 22 is formed such that the lower surface (that is, the position of the boundary with the base layer 21 in the Z-axis direction) is located between the first peak position P1 and the second peak position P2 of the base layer 21. In other words, the concentration profile of the source region 22 and the concentration profile of the base layer 21 have a crossing portion between the first peak position P1 and the second peak position P2. In this case, it is preferable that the source region 22 has a concentration profile in which the lower surface matches the low concentration peak position P0. In the present embodiment, matching of the lower surface of the source region 22 and the low concentration peak position P0 includes not only a perfect matching but also a slight deviation due to manufacturing errors or the like. For example, matching of the lower surface of the source region 22 and the low concentration peak position P0 includes a case where the lower surface of the source region 22 is apart from the low concentration peak position P0 toward the first peak position P1 by about 10% of a distance between the low concentration peak position P0 and the first peak position P1. Matching of the lower surface of the source region 22 and the low concentration peak position P0 also includes a case where the lower surface of the source region 22 is apart from the low concentration peak position P0 toward the second peak position P2 by about 10% of a distance between the low concentration peak position P0 and the second peak position P2.

The configuration of the SiC semiconductor device according to the present embodiment is described above. The following describes the operation and advantageous effects of the SiC semiconductor device.

First, in the SiC semiconductor device, an inversion layer is not formed in the base layer 21 in an off-state before a gate voltage is applied to the gate electrode 27. Therefore, even if a positive voltage such as 1600 V is applied to the drain electrode 32, electrons do not flow from the source region 22 into the base layer 21, and the SiC semiconductor device is in the off-state in which a current does not flow between the source electrode 29 and the drain electrode 32.

In a case where the SiC semiconductor device is in the off-state, an electrical field is applied between the drain and gate, and the electrical field concentration occurs at the bottom portion of the gate insulating film 26. However, in the SiC semiconductor device described above, the first deep layer 15 and the JFET portion 14 are provided at positions deeper than the trenches 25. Therefore, a depletion layer formed between the first deep layer 15 and the JFET portion 14 suppresses the rising of equipotential lines due to an influence of the drain voltage, and makes a high electric field difficult to enter the gate insulating film 26. Therefore, in the present embodiment, breakdown of the gate insulating film 26 can be suppressed.

The FLR region 2a includes the first FLR portions 16 and the second FLR portions 24. A depletion layer formed between the first FLR portions 16 and the second FLR portions 24 suppresses the concentration of the equipotential lines due to an influence of the drain voltage. Therefore, the breakdown voltage of the FLR region 2a can be improved.

In the present embodiment, the first FLR portions 16 and the second FLR portions 24 of the present embodiment are formed in such a manner that the gaps between the adjacent first FLR portions 16 and the gaps between the adjacent second FLR portions 24 are located in different positions. Therefore, it is possible to further suppress the concentration of the equipotential lines due to the influence of the drain voltage.

When a voltage higher than the threshold voltage in the insulated gate structure, for example, 20 V is applied to the gate electrode 27, an inversion layer is formed on the surface of the base layer 21 that is in contact with the trench 25. As a result, a current flows between the source electrode 29 and the drain electrode 32, and the SiC semiconductor device is turned on. In the present embodiment, since the electrons having passed through the inversion layer pass through the current spreading layer 17, the JFET portion 14 and the low concentration layer 13 to the substrate 11, it is conceivable that the drift layer 19 includes the current spreading layer 17, the JFET portion 14 and the low concentration layer 13.

Figure 4:
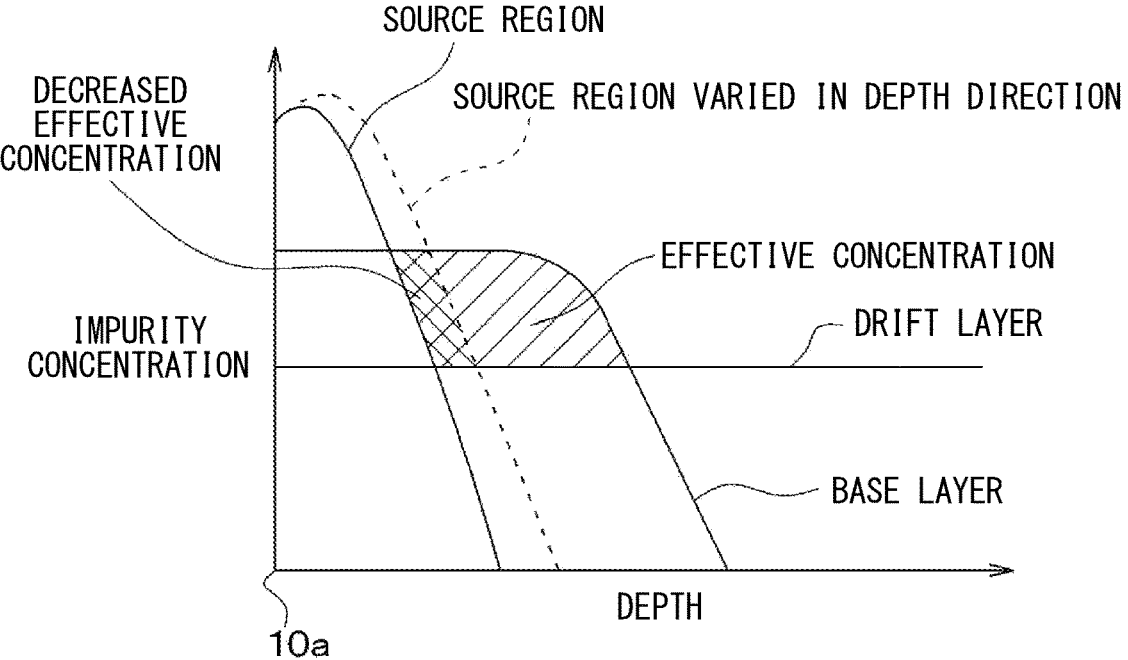
FIG. 4 is a diagram for explaining an effective concentration related to a threshold voltage.

The threshold voltage in the insulated gate structure depends on the effective concentration of impurities forming the base layer 21 (hereinafter also simply referred to as the effective concentration). As shown in FIG. 4, the effective concentration is a region surrounded by the drift layer 19, the source region 22, and the base layer 21 in the concentration profile. Therefore, if the depth of the source region 22 varies, the effective concentration changes and the threshold voltage changes. For example, as shown in FIG. 4, when the depth of the source region 22 varies and becomes deeper, the effective concentration decreases, resulting in a lower threshold voltage. In this case, if the depth of the source region 22 varies in the portion where the impurity concentration of the base layer 21 is high, the effective concentration decreases more. FIG. 4 shows a case where the impurity concentration of the base layer 21 is constant from the first surface 10a of the semiconductor substrate 10 to a predetermined depth.

Therefore, in the present embodiment, as described above, the base layer 21 has the concentration profile having the low concentration peak, the first high concentration peak, and the second high concentration peak in the Z-axis direction. The source region 22 has the concentration profile in which the lower surface intersects a portion of the base layer 21 located between the first peak position P1 and the second peak position P2. Accordingly, the base layer 21 can have the concentration profile in which the lower surface of the source region 22 is less likely to intersect the portion of the base layer 21 where the impurity concentration is high even if the depth of the source region 22 varies. Therefore, even if the depth of the source region 22 varies, the change in effective concentration is likely to be small, and the change in threshold voltage can be suppressed.

Next, a method for manufacturing the SiC semiconductor device according to the present embodiment will be described with reference to FIGS. 5A to 5G.

Figure 5A:
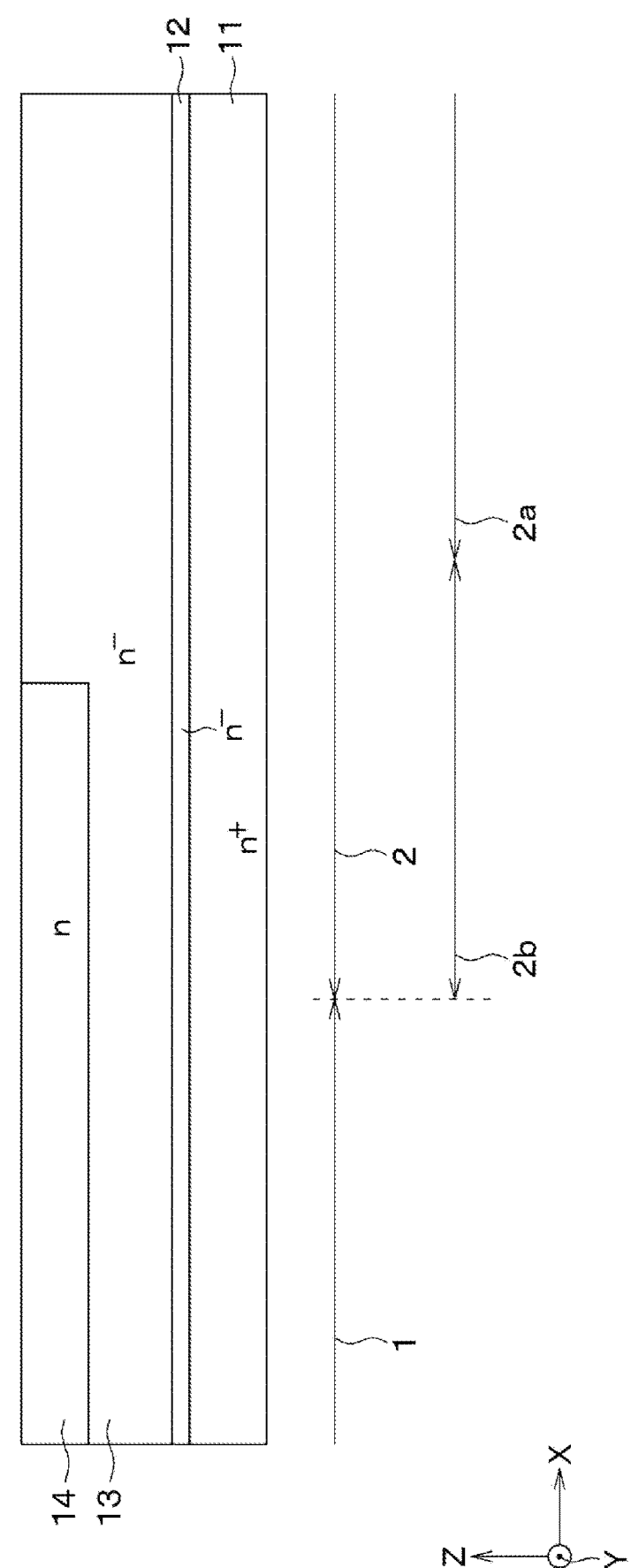
FIG. 5A is a cross-sectional view showing a manufacturing process of the SiC semiconductor device shown in FIG. 1.

First, as shown in FIG. 5A, the substrate 11 having the buffer layer 12, the low concentration layer 13, and the JFET portion 14 made of SiC on its surface is prepared.

Figure 5B:
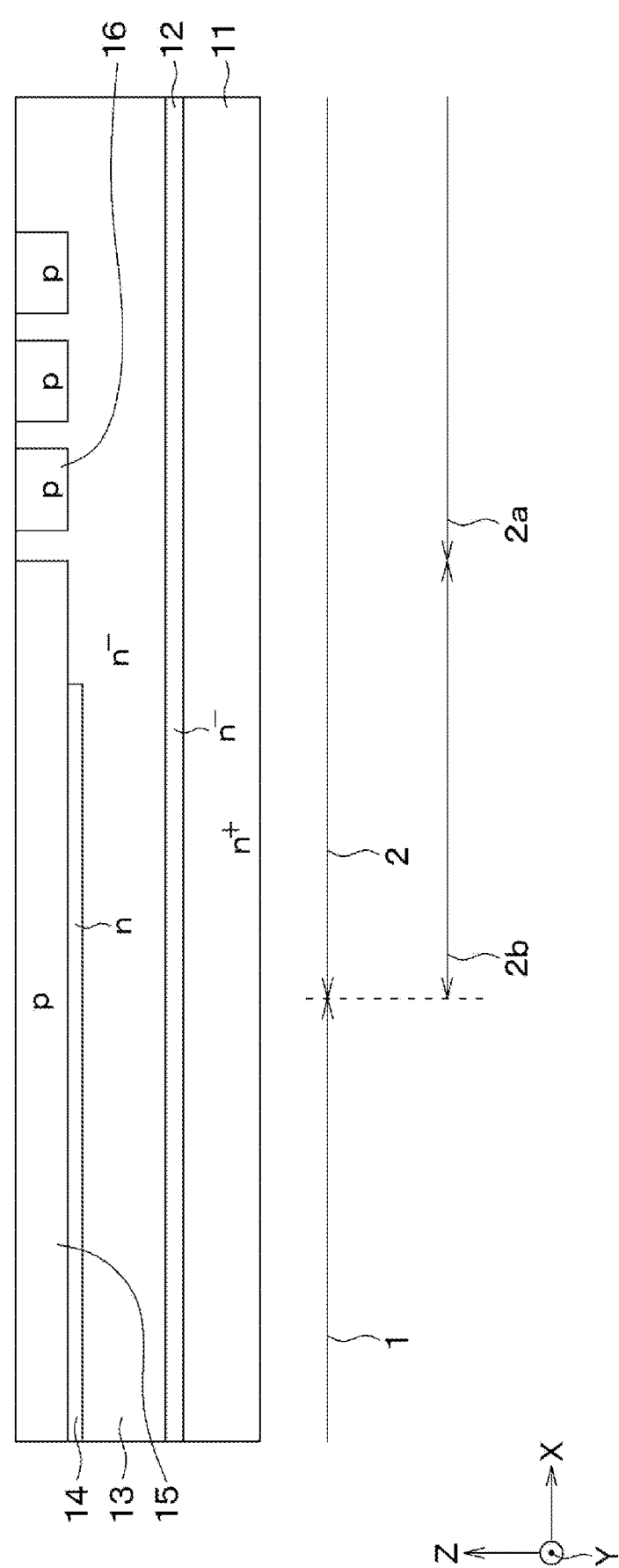
FIG. 5B is a cross-sectional view showing a manufacturing process of the SiC semiconductor device continued from FIG. 5A.

Then, as shown in FIG. 5B, the first deep layer 15 and the first FLR portions 16 are formed by performing ion implantation using a mask (not shown). In the present embodiment, the first deep layer 15 and the first FLR portions 16 are simultaneously formed by the ion implantation. As a result, the first deep layer 15 and the first FLR portions 16 have the same bottom surface depth, the same thickness, and the same impurity concentration.

Figure 5C:
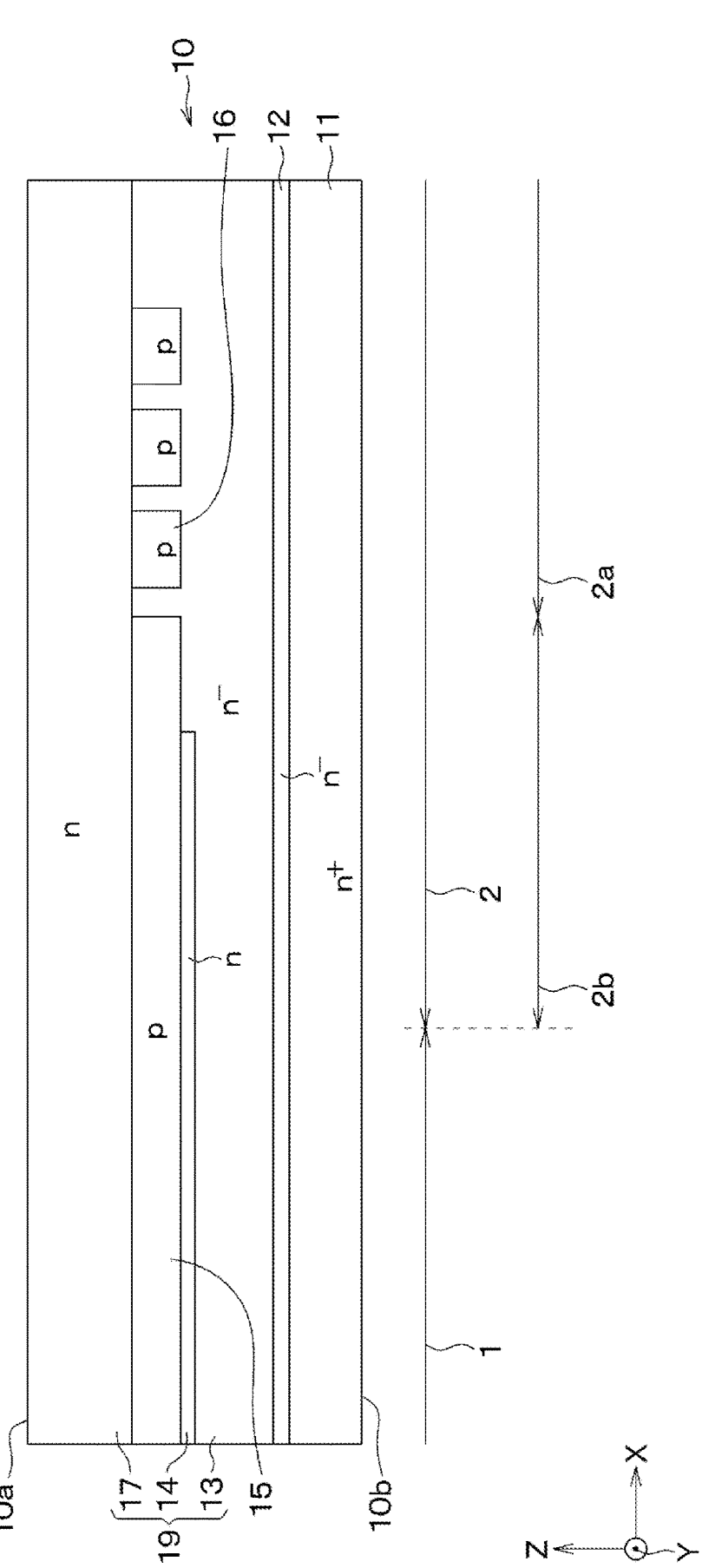
FIG. 5C is a cross-sectional view showing a manufacturing process of the SiC semiconductor device continued from FIG. 5B.

Subsequently, as shown in FIG. 5C, the current spreading layer 17 is epitaxially grown above the low concentration layer 13, the JFET portions 14, the first deep layer 15, and the first FLR portions 16 to form the semiconductor substrate 10.

Figure 5D:
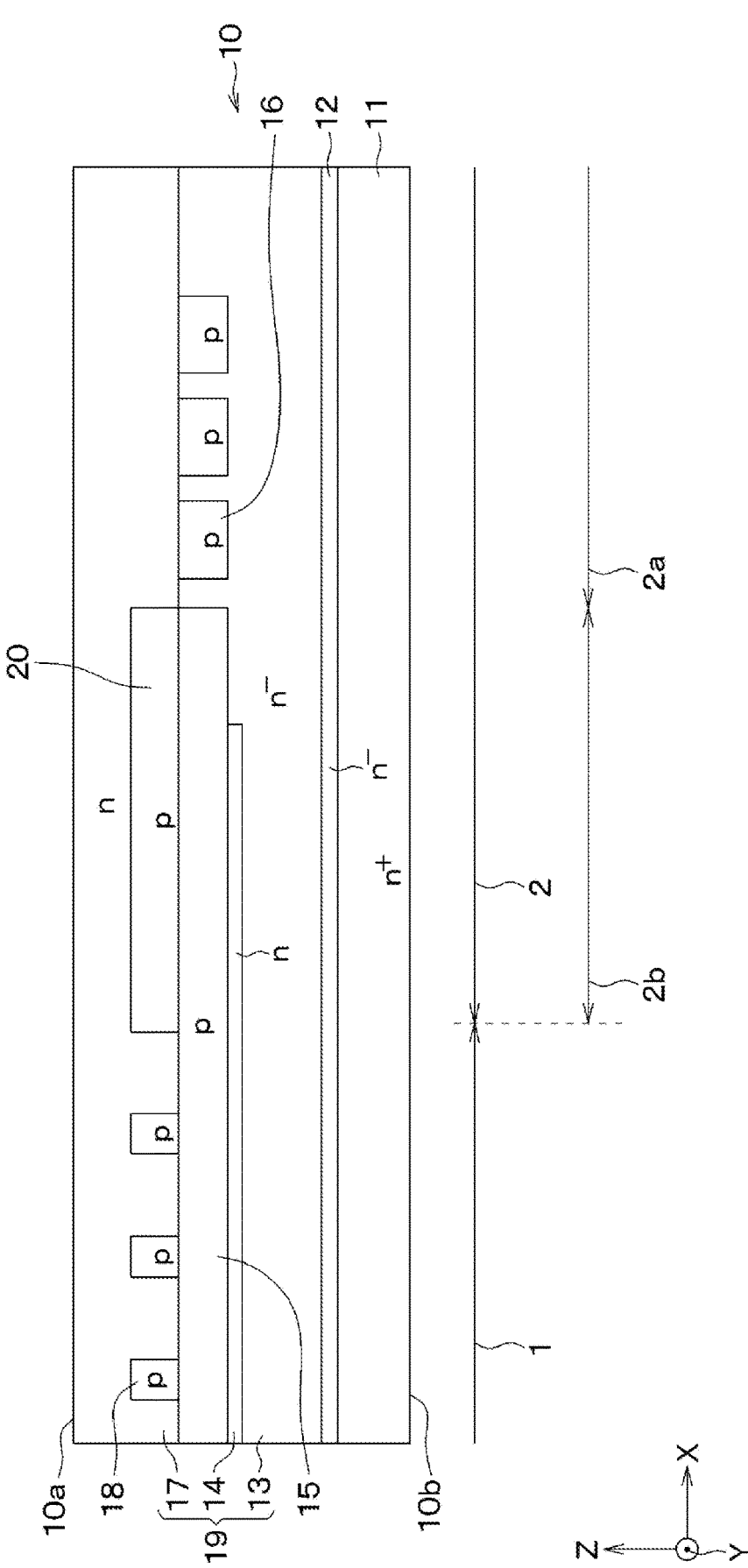
FIG. 5D is a cross-sectional view showing a manufacturing process of the SiC semiconductor device continued from FIG. 5C.

Next, as shown in FIG. 5D, the second deep layer 18 and the RESURF layer 20 are formed by ion-implanting p-type impurities onto the current spreading layer 17 using a mask (not shown).

Figure 5E:
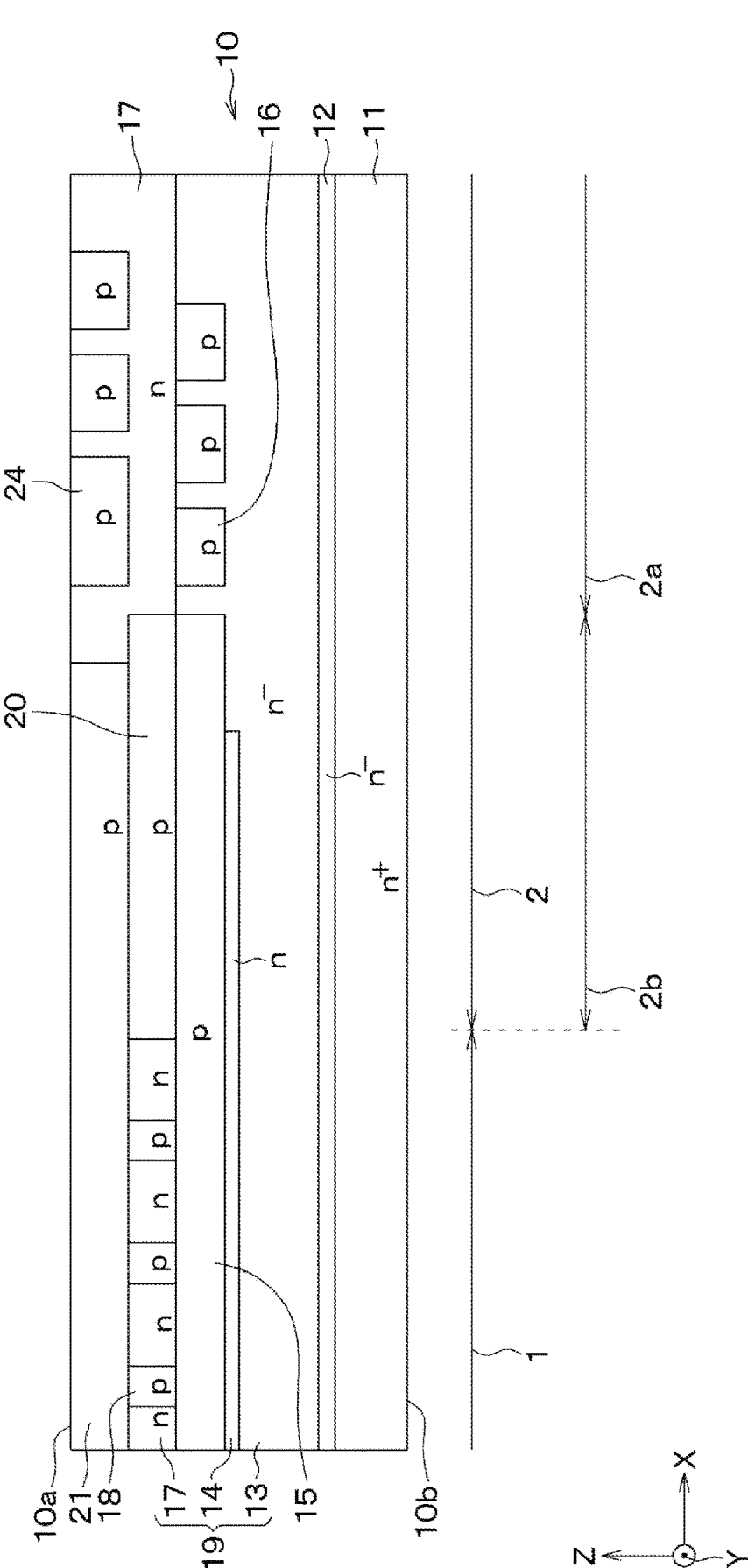
FIG. 5E is a cross-sectional view showing a manufacturing process of the SiC semiconductor device continued from FIG. 5D.

Subsequently, as shown in FIG. 5E, the base layer 21 and the second FLR portions 24 are simultaneously formed by ion-implanting p-type impurities onto the current spreading layer 17 using a mask (not shown). In the present embodiment, when forming the base layer 21 and the second FLR portions 24, the base layer 21 and the second FLR portions 24 are formed so as to have a concentration profile having the low concentration peak, the first high concentration peak, and the second high concentration peak as described above. Specifically, the base layer 21 and the second FLR portions 24 having the above-described concentration profile are formed by performing ion implantation multiple times while changing the acceleration energy.

Figure 5F:
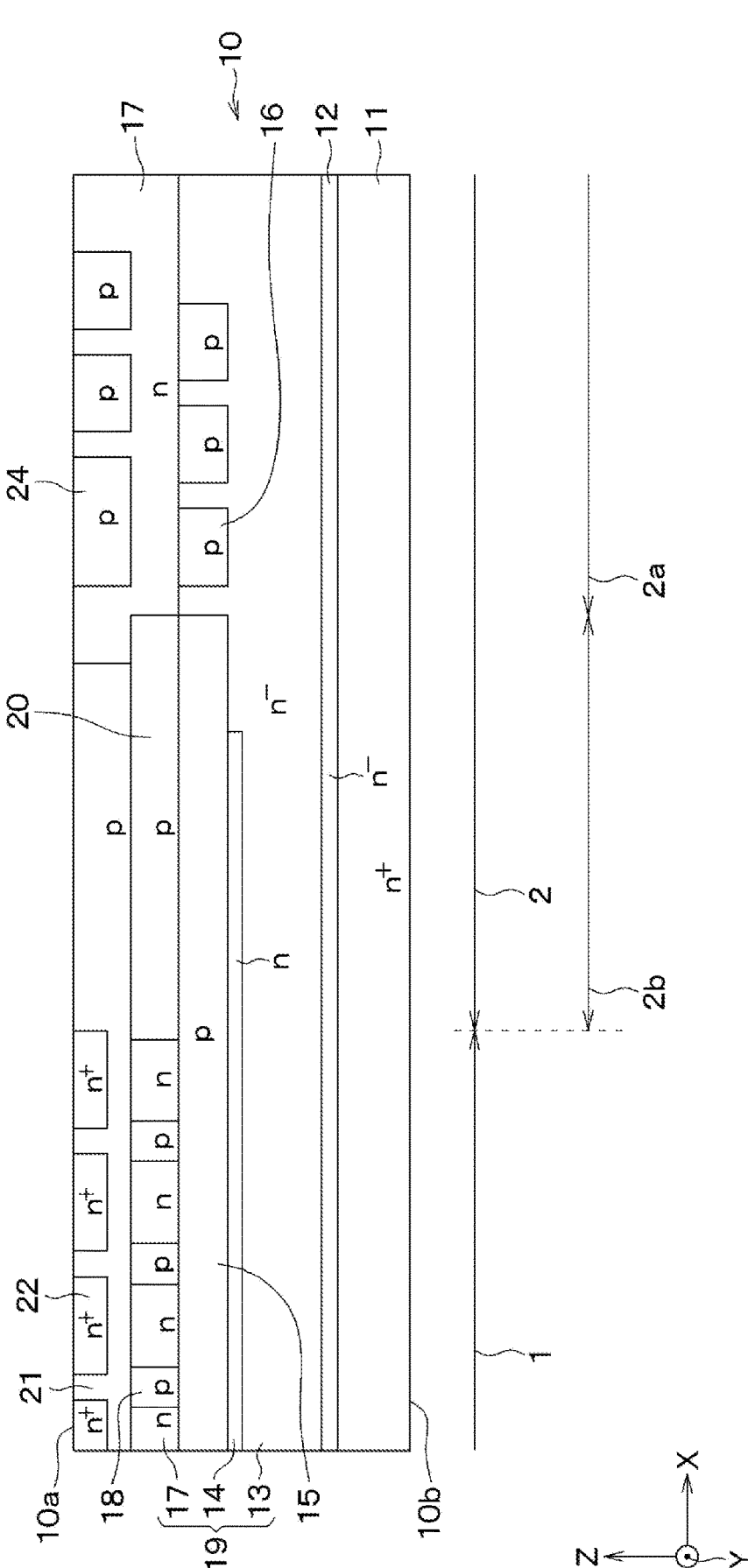
FIG. 5F is a cross-sectional view showing a manufacturing process of the SiC semiconductor device continued from FIG. 5E.

Next, as shown in FIG. 5F, the source region 22 is formed by ion-implanting n-type impurities onto the current spreading layer 17 using a mask (not shown). At this time, as described above, the source region 22 is formed such that the lower surface is located between the first peak position P1 and the second peak position P2 of the base layer 21. More preferably, the source region 22 is formed so that the lower surface intersects the low concentration peak position P0. Accordingly, even if the depth of the source region 22 varies, the change in effective concentration is likely to be small, and the change in threshold voltage can be suppressed.

Figure 5G:
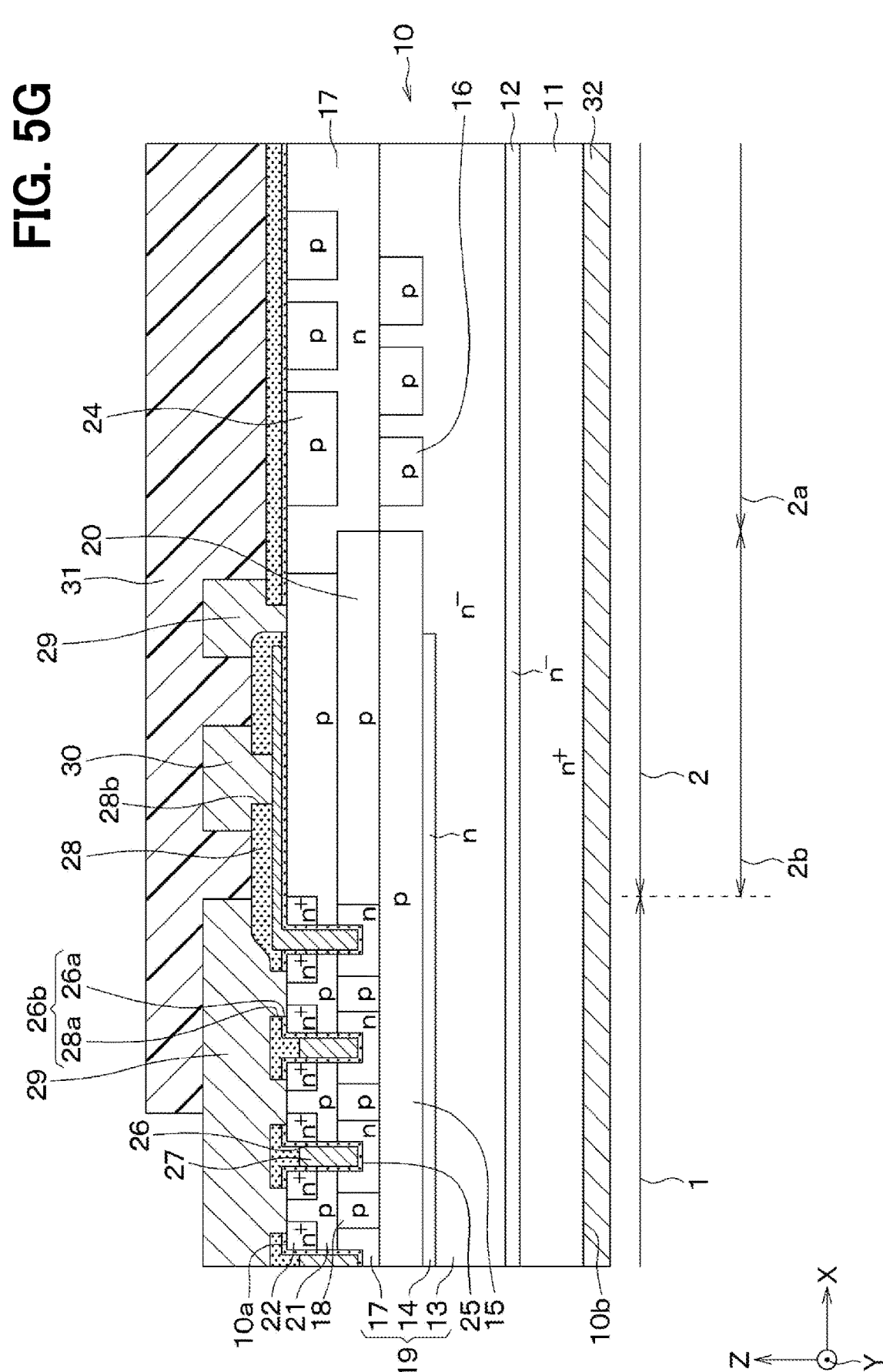
FIG. 5G is a cross-sectional view showing a manufacturing process of the SiC semiconductor device continued from FIG. 5F.

Thereafter, as shown in FIG. 5G, a predetermined semiconductor manufacturing process is performed to form the trench gate structure and the like although detailed processes are omitted. In this way, the SiC semiconductor device of the present embodiment is manufactured.

According to the present embodiment described above, the base layer 21 has the concentration profile having the low concentration peak, the first high concentration peak, and the second high concentration peak in the depth direction. The source region 22 has the concentration profile in which the lower surface intersects the portion of the base layer 21 located between the first peak position P1 and the second peak position P2. Accordingly, the base layer 21 can have the concentration profile in which the lower surface of the source region 22 is less likely to intersect the portion of the base layer 21 where the impurity concentration is high even if the depth of the source region 22 varies. Therefore, even if the depth of the source region 22 varies, the change in effective concentration is likely to be small, and the change in threshold voltage can be suppressed. In a case where the lower surface of the source region 22 is formed so as to intersect the low concentration peak position P0 of the base layer 21, the fluctuation of the threshold voltage can be further suppressed.

In the present embodiment, the second FLR portions 24 have the same concentration profile as the base layer 21. Therefore, the second FLR portions 24 and the base layer 21 can be formed in the same process, and an increase in the number of manufacturing processes can be suppressed.

In the present embodiment, the first FLR portions 16 having portions facing the second FLR portions 24 are formed inside the drift layer 19. Therefore, it is possible to further suppress the concentration of equipotential lines due to the influence of the drain voltage, and improve the breakdown voltage of the FLR region 2a compared to a case where the first FLR portions 16 are not formed.

In the present embodiment, the impurity concentration at the first peak position P1 (that is, the first high concentration peak) is higher than the impurity concentration at the second peak position P2 (that is, the second high concentration peak). Therefore, positions where electric field concentration is likely to occur in the base layer 21 and the second FLR portions 24 can be set away from the first surface 10a of the semiconductor substrate 10. Therefore, injection of hot electrons into the gate insulating film 26 formed in the FLR region 2a can be easily suppressed, and fluctuation of the breakdown voltage can be suppressed.

Second Embodiment

The following describes a second embodiment. In the present embodiment, a position of the second peak position P2 is changed from the first embodiment. The other configurations are the same as those of the first embodiment, and therefore a description of the same configurations will be omitted below.

Figure 6:
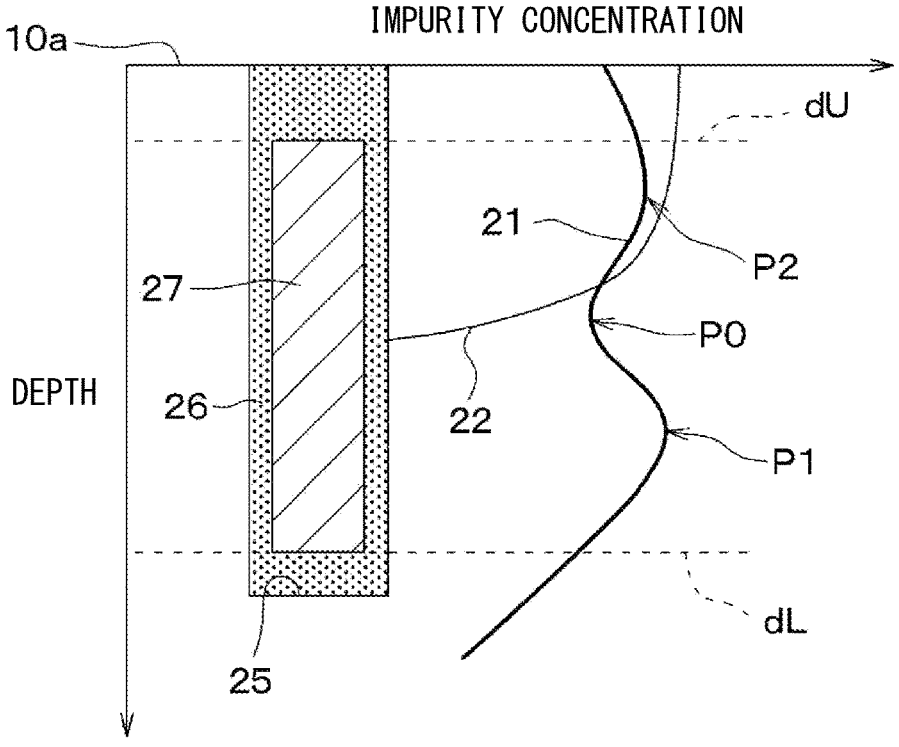
FIG. 6 is a diagram showing a relationship between a depth of a semiconductor substrate and an impurity concentration in a second embodiment.

In the semiconductor device of the present embodiment, as shown in FIG. 6, the base layer 21 is formed so as to have a concentration profile in which the second peak position P2 is located between the low concentration peak position P0 and the second depth position dU. The SiC semiconductor device having the above-described concentration profile can be formed by appropriately changing the acceleration energy of ion implantation performed when forming the base layer 21.

According to the present embodiment described above, since the source region 22 has a concentration profile in which the lower surface intersects with the portion of the base layer 21 located between the first peak position P1 and the second peak position P2, effects similar to those of the first embodiment can be obtained.

As in the present embodiment, the base layer 21 may have a concentration profile in which the second peak position P2 is located between the low concentration peak position P0 and the second depth position dU. According to this configuration, it becomes unnecessary to control the second peak position P2 in detail, and the manufacturing process can be simplified.

Third Embodiment

The following describes a third embodiment. In the present embodiment, the magnitudes of the first high concentration peak and the second high concentration peak are changed from those of the first embodiment. The other configurations are the same as those of the first embodiment, and therefore a description of the same configurations will be omitted below.

Figure 7:
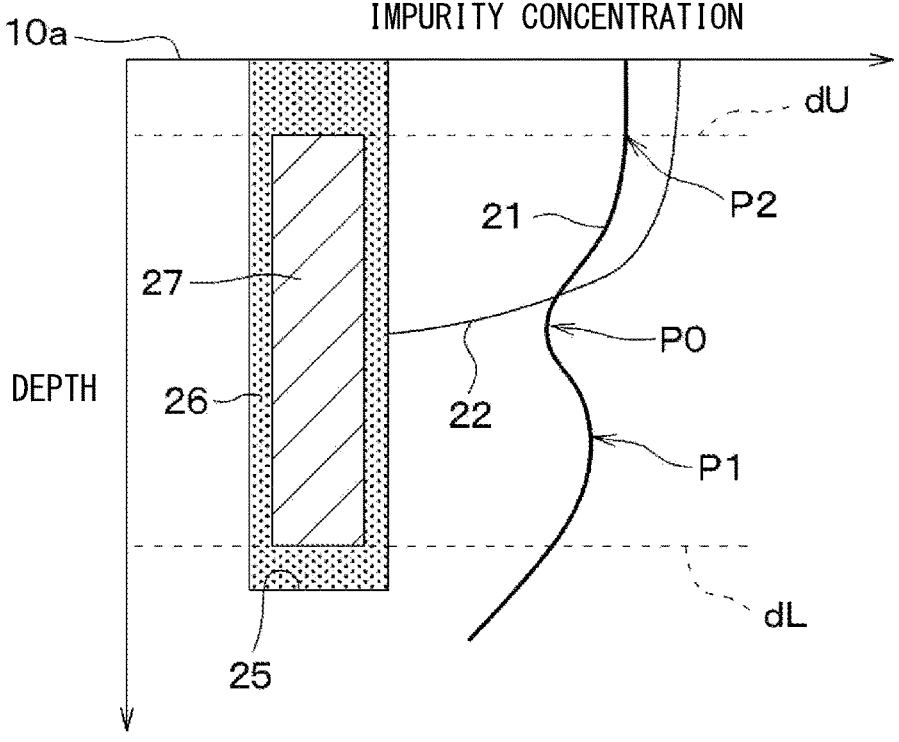
FIG. 7 is a diagram showing a relationship between a depth of a semiconductor substrate and an impurity concentration in a third embodiment.

In the semiconductor device of the present embodiment, as shown in FIG. 7, the base layer 21 has an impurity concentration at the second peak position P2 (that is, the second high concentration peak) that is higher than the impurity concentration at the first peak position P1 (that is, the first high concentration peak). The SiC semiconductor device having the above-described concentration profile can be formed by appropriately changing the acceleration energy of ion implantation performed when forming the base layer 21.

According to the present embodiment described above, since the source region 22 has a concentration profile in which the lower surface intersects with the portion of the base layer 21 located between the first peak position P1 and the second peak position P2, effects similar to those of the first embodiment can be obtained.

In the present embodiment, the impurity concentration at the second peak position P2 (that is, the second high concentration peak) is higher than the impurity concentration at the first peak position P1 (that is, the first high concentration peak). The second FLR portions 24 have the same concentration profile as the base layer 21. Therefore, the breakdown voltage of the FLR region 2*a* is dominated by the impurity concentration at the second peak position P2. Therefore, even if the impurity concentration at the first peak position P1 is changed in order to adjust the threshold voltage, the breakdown voltage of the FLR region 2*a* is less likely to fluctuate, thereby improving the degree of freedom in design.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in the above-described embodiments, the MOSFET of the n channel type trench gate structure in which a first conductivity type is n type and a second conductivity type is p type has been described as an example of the semiconductor switching element. However, this is merely an example, and a semiconductor switching element of another structure, for example, a MOSFET of a trench gate structure of a p channel type in which the conductivity type of each component is inverted with respect to the n channel type may also be used. Other than the MOSFET, the semiconductor device may be formed with an insulated-gate bipolar transistor (IGBT) with a similar structure. In the case of IGBT, the n$^+$-type substrate 11 in the first embodiments is replaced by a p$^+$-type collector layer. Other than that, the IGBT is similar to the MOSFET as described in the first embodiment.

Further, in each of the above-described embodiments, an example in which the semiconductor substrate 10 is made of SiC has been described. However, the semiconductor substrate 10 may be configured using a silicon substrate, another compound semiconductor substrate, or the like.

In each of the above-described embodiments, a contact region may be formed at a surface portion of the base layer 21 located opposite from the trench 25 across the source region 22. The contact region is a part of the base layer 21 and a surface concentration of a portion exposed from the first surface 10*a* is higher than the other part of the base layer 21.

Each of the above embodiments describes that the first deep layer 15 extends along the X-axis direction. However, the first deep layer 15 may extend along the Y-axis direction.

In each of the above-described embodiments, the JFET portion 14, the first deep layer 15, the second deep layer 18, and the like may be omitted. In each of the above-described embodiments, the first FLR portions 16 and the second FLR portions 24 may be omitted.

Further, the above embodiments may be combined together as appropriate. For example, the second embodiment may be combined with the third embodiment so that the second peak position P2 is located between the second depth position dU and the low concentration peak position P0, and the impurity concentration at the second peak position P2 is set to be higher than the impurity concentration at the first peak position P1.

What is claimed is:

1. A semiconductor device comprising a cell region, an outer peripheral region surrounding the cell region, and a semiconductor element disposed in the cell region, the semiconductor element including:

a drift layer of a first conductivity type;

a base layer of a second conductivity type disposed in a surface layer portion of the drift layer;

an impurity region of the first conductivity type disposed in a surface layer portion of the base layer, the impurity region having an impurity concentration higher than an impurity concentration of the drift layer;

a trench gate structure including a trench penetrating the impurity region and the base layer to reach the drift layer, a gate insulating film disposed on a wall surface of the trench, and a gate electrode disposed on the gate insulating film;

a high concentration layer of the first conductivity type or the second conductivity type disposed opposite from the base layer across the drift layer, the high concentration layer having an impurity concentration higher than the impurity concentration of the drift layer;

a first electrode electrically connected to the base layer and the impurity region; and a second electrode electrically connected to the high concentration layer, wherein an end portion of the gate electrode located adjacent to a bottom of the trench is defined as a lower end portion, an end portion of the gate electrode located adjacent to an opening of the trench is defined as an upper end portion, and a direction in which the drift layer and the base layer are stacked is defined as a depth direction, the base layer has a concentration profile of an impurity concentration in the depth direction, and in the concentration profile, the base layer has a low concentration peak, at which the impurity concentration is minimum, at a position between a portion of the base layer located at a same depth as the lower end portion and a portion of the base layer located at a same depth as the upper end portion, a position at which the impurity concentration of the base layer is maximum between the portion of the base layer at the same depth as the lower end portion and a position of the low concentration peak is defined as a first peak position, and a position at which the impurity concentration of the base layer is maximum between the position of the low concentration peak and the portion of the base layer at the same depth as the upper end portion is defined as a second peak position, the impurity region has a boundary with the base layer in the depth direction at a position between the first peak position and the second peak position, the drift layer is also disposed in the outer peripheral region, the outer peripheral region includes a first field limiting ring (FLR) portion of the second conductivity type disposed inside the drift layer, and a second FLR portion of the second conductivity type disposed in the surface layer portion of the drift layer, each of the first FLR portion and the second FLR portion has a frame shape surrounding the cell region, the second FLR portion has a concentration profile of an impurity concentration same as the concentration profile of the impurity concentration of the base layer, and the first FLR portion has a portion facing the second FLR portion.

2. A semiconductor device comprising a semiconductor element, the semiconductor element including:

a drift layer of a first conductivity type;

a base layer of a second conductivity type disposed in a surface layer portion of the drift layer;

an impurity region of the first conductivity type disposed in a surface layer portion of the base layer, the impurity region having an impurity concentration higher than an impurity concentration of the drift layer;

a trench gate structure including a trench penetrating the impurity region and the base layer to reach the drift layer, a gate insulating film disposed on a wall surface of the trench, and a gate electrode disposed on the gate insulating film;

a high concentration layer of the first conductivity type or the second conductivity type disposed opposite from the base layer across the drift layer, the high concentration layer having an impurity concentration higher than the impurity concentration of the drift layer;

a first electrode electrically connected to the base layer and the impurity region; and a second electrode electrically connected to the high concentration layer, wherein an end portion of the gate electrode located adjacent to a bottom of the trench is defined as a lower end portion, an end portion of the gate electrode located adjacent to an opening of the trench is defined as an upper end portion, and a direction in which the drift layer and the base layer are stacked is defined as a depth direction, the base layer has a concentration profile of an impurity concentration in the depth direction, and in the concentration profile, the base layer has a low concentration peak, at which the impurity concentration is minimum, at a position between a portion of the base layer located at a same depth as the lower end portion and a portion of the base layer located at a same depth as the upper end portion, a position at which the impurity concentration of the base layer is maximum between the portion of the base layer at the same depth as the lower end portion and a position of the low concentration peak is defined as a first peak position, and a position at which the impurity concentration of the base layer is maximum between the position of the low concentration peak and the portion of the base layer at the same depth as the upper end portion is defined as a second peak position, the impurity region has a boundary with the base layer in the depth direction at a position between the first peak position and the second peak position, and the impurity concentration of the base layer at the first peak position is higher than the impurity concentration of the base layer at the second peak position.

3. The semiconductor device according to claim 1, wherein the impurity concentration at the second peak position is higher than the impurity concentration at the first peak position.

4. A semiconductor device comprising a semiconductor element, the semiconductor element including:

a drift layer of a first conductivity type;

a base layer of a second conductivity type disposed in a surface layer portion of the drift layer;

an impurity region of the first conductivity type disposed in a surface layer portion of the base layer, the impurity region having an impurity concentration higher than an impurity concentration of the drift layer;

a trench gate structure including a trench penetrating the impurity region and the base layer to reach the drift layer, a gate insulating film disposed on a wall surface of the trench, and a gate electrode disposed on the gate insulating film;

a high concentration layer of the first conductivity type or the second conductivity type disposed opposite from the base layer across the drift layer, the high concentration layer having an impurity concentration higher than the impurity concentration of the drift layer;

a first electrode electrically connected to the base layer and the impurity region; and a second electrode electrically connected to the high concentration layer, wherein an end portion of the gate electrode located adjacent to a bottom of the trench is defined as a lower end portion, an end portion of the gate electrode located adjacent to an opening of the trench is defined as an upper end portion, and a direction in which the drift layer and the base layer are stacked is defined as a depth direction, the base layer has a concentration profile of an impurity concentration in the depth direction, and in the concentration profile, the base layer has a low concentration peak, at which the impurity concentration is minimum, at a position between a portion of the base layer located at a same depth as the lower end portion and a portion of the base layer located at a same depth as the upper end portion, a position at which the impurity concentration of the base layer is maximum between the portion of the base layer at the same depth as the lower end portion and a position of the low concentration peak is defined as a first peak position, and a position at which the impurity concentration of the base layer is maximum between the position of the low concentration peak and the portion of the base layer at the same depth as the upper end portion is defined as a second peak position, the impurity region has a boundary with the base layer in the depth direction at a position between the first peak position and the second peak position, and the position of the boundary of the impurity region with the base layer in the depth direction matches a level of the position of the low concentration peak in the depth direction.

*    *    *    *    *